United States Patent [19]

Giles et al.

[11] Patent Number: 6,085,334
[45] Date of Patent: Jul. 4, 2000

[54] METHOD AND APPARATUS FOR TESTING AN INTEGRATED MEMORY DEVICE

[75] Inventors: Grady Lawrence Giles; Kerry Ken Kanbe; William Clayton Bruce, Jr., all of Austin, Tex.

[73] Assignee: Motorola, Inc., Schaumburg, Ill.

[21] Appl. No.: 09/061,983

[22] Filed: Apr. 17, 1998

[51] Int. Cl.[7] .................................................. H02H 3/05
[52] U.S. Cl. .................................. 714/7; 714/8; 714/30; 714/710
[58] Field of Search .................................. 714/1, 2, 5, 7, 714/8, 30, 42, 710, 711

[56] References Cited

U.S. PATENT DOCUMENTS

| | | | |
|---|---|---|---|
| 4,939,694 | 7/1990 | Eaton et al. | 365/200 |
| 5,909,404 | 6/1999 | Schwarz | 365/201 |
| 5,956,350 | 9/1999 | Irrinki et al. | 714/718 |
| 5,987,632 | 11/1999 | Irrinki et al. | 714/711 |
| 5,994,915 | 11/1999 | Farnworth et al. | 324/765 |

OTHER PUBLICATIONS

Jeffrey Dreibelbis et al., "Processor–Based Built–In Self–Test for Embedded DRAM", Nov. 1998 IEEE Journal of Solid–State Circuits, vol. 33, No. 11, pp. 1731–1740.

"Built–In Self–Repair Circuit for High–Density ASMIC", Sawada, et al.; IEEE 1989 Custom Integrated Circuits Conference; pp. 26.1.1–26.1.4.

Primary Examiner—Dennis M. Butler

[57] ABSTRACT

A method of memory array testing that detects defects which are sensitive to environmental conditions. A repair signature is generated reflecting the repair state of the memory. A memory device is rejected if there is a change in the repair signature of the memory array over the operating range of the device. In one embodiment, an integrated circuit includes a memory array, spare memory elements for repairing defective locations of the memory array, a built-in self-test (BIST) circuit for detecting faults in the memory array, a built-in self-repair (BISR) circuit for causing the failed memory location of the memory array to be replaced with a spare memory element, and a signature generator where the signature is based on a compression of addresses corresponding to failed memory locations, wherein the signature is used to determine that a repair result of the memory array is invariant over different environmental conditions.

24 Claims, 3 Drawing Sheets

//  6,085,334

METHOD AND APPARATUS FOR TESTING AN INTEGRATED MEMORY DEVICE

FIELD OF THE INVENTION

The present invention relates generally to integrated memory testing and more particularly to the built-in self-test and self-repair of memory devices.

BACKGROUND OF THE INVENTION

A typical memory device is composed of a plurality of memory elements or cells defining a memory array, and may contain a plurality of memory arrays. A memory cell in the memory array is accessed by row and column locations. Typically, each cell will have an associated address and a row decoder will be used to select the row portion of the address while a column decoder will select the column of the cell. The memory array may include redundant elements for use as replacement elements for defects. The redundant elements are effectively spare elements. Redundant elements are allocated either as a row or as a column. For example, in a memory device having only row redundancy, if any cell in a row is defective, the entire row of cells will be replaced. Redundant elements may be arranged in a global or a local fashion. Local redundant elements are provided per memory array and cannot be applied to other memory arrays within a memory system. Global redundant elements are available for replacement of elements within any memory array in the memory system.

In production it is necessary to assure the quality and operation of a memory device. Typically, a predetermined test pattern sequence is used to test each cell in the memory. The pattern may include any number of steps, each step consisting of a number of read/write sequences. A typical test method initially writes a first value to a memory cell to be tested. The test then reads that memory cell to verify that the value is stored in the memory cell. The test then writes a second value to the memory cell, where the second value is the complement of the first value. Storage of the second value is then verified. If the memory cell fails any step within the test method, the memory cell is considered defective. The testing of memory may be performed by an external tester, such as an automatic test equipment (ATE), or may be performed internally in the memory device. Internal testing is referred to as built-in self-test (BIST).

On detection of a defect in a memory cell error, i.e. test failure, it is desirable to replace that memory cell with a redundant element. For example, replacement of a defective cell with a spare row, or redundant element, is referred to as a repair. A row repair of a memory cell involves configuring the address input to select the spare row instead of the defective row. In effect, the spare row replaces the row containing the defective cell. Similarly, it is also possible to replace all cells in a column of a memory array, where the redundant element is a column, and the entire column containing the defective cell is replaced. Repair of the memory array may also be performed externally to the memory device, where the defective cells are tested and recorded or marked, and then a permanent replacement is made to redundant elements. One method of repair involves laser repair, which creates an open circuit to program a redundant element to respond to the address of the defective cell. The laser effects programming by selectively cutting a metal trace coupled to the address logic of the defective cell. The additional circuitry required to facilitate such programming and the additional production step to perform laser cutting result in additional cost.

Memory cell repair may be performed internally by a built-in self-repair (BISR) circuit. The BISR is typically used in conjunction with the BIST, but facilitates repair internally, without the use of external methods, such as laser cutting. The BISR performs an electrical repair, which may be permanent or temporary. A permanent repair uses non-volatile technology, such as electrically erasable programmable memory, one time programmable memory (OTP), or flash memory. Incorporation of non-volatile memory technology strictly for repair functions is cost prohibitive and is not often considered unless the integrated circuit device has already included this technology for other features. Temporary repair utilizes conventional logic and may be implemented without additional fabrication steps. Temporary repair offers a cost effective method of replacement, but the repairs must be made each time the device is powered up. This is true during production testing, and continues throughout the life of the device. The user must continue to repair any defective memory cells every time the device is powered up. A drawback associated with temporary repair is the lack of certainty that the same repairs will be made to the device in a user's system as were made in production testing. The concern is that environmental changes may have an effect on the operation of memory cells. Environmental conditions include operating voltage, temperature, frequency of the device, etc.

For example, production testing may discover a failure that occurs in a given environmental condition, such as at high temperature. The failure may be repaired by replacing the defective memory cell, so the memory device is not rejected. If the user performs the BISR at room temperature, where the user's environmental condition does not cause the high temperature failure, the BISR will not repair the defective cell. If the user's system later encounters the original environmental condition that caused the failure in production testing, i.e. high temperature, the memory cell will fail. There is a need for detecting memory device defects, where the defects are sensitive to environmental conditions and are not exhibited over the entire operating range of the device.

DETAILED DESCRIPTION OF THE PREFERRED EMBODIMENT

Figure 1:
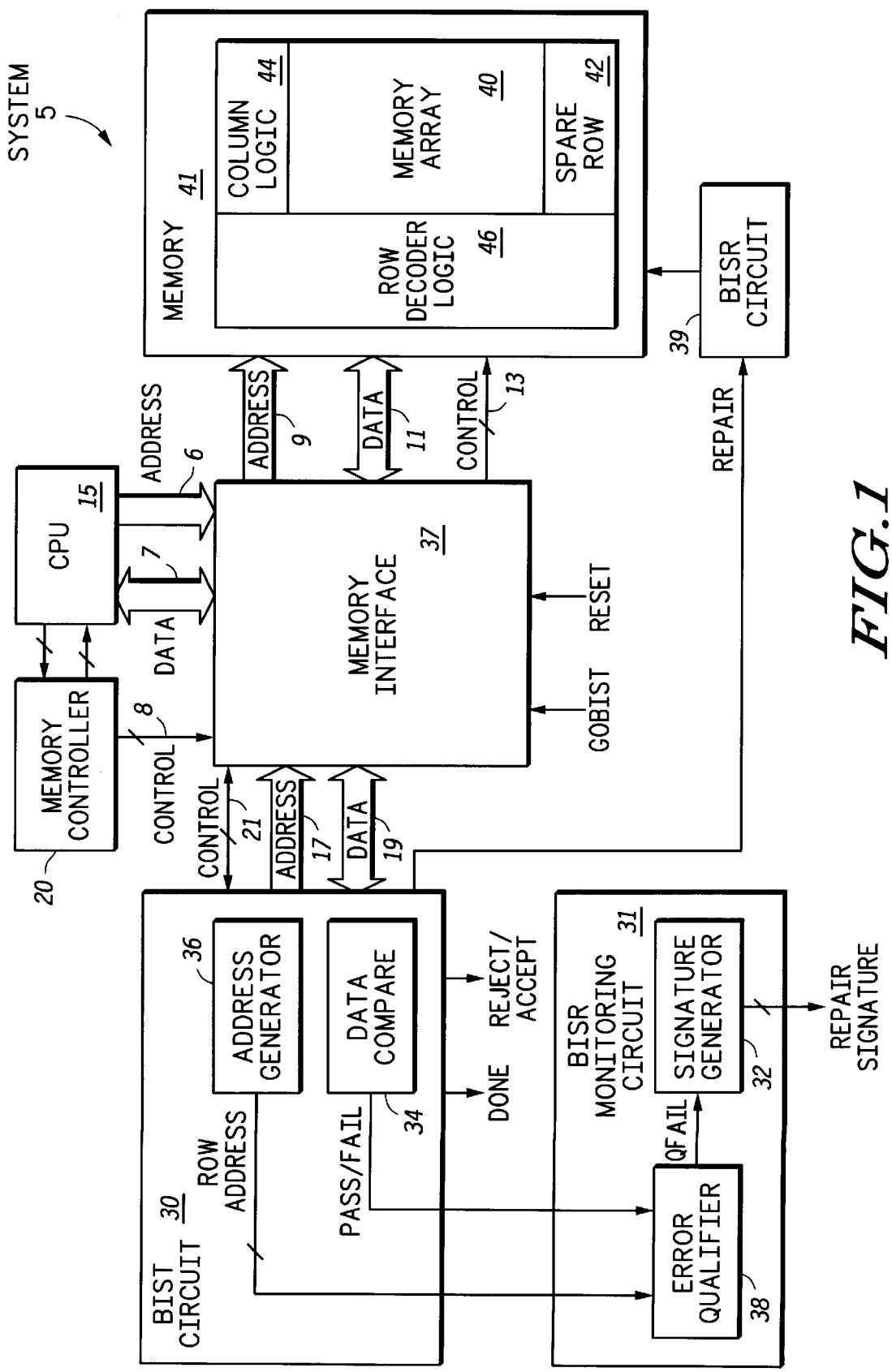
FIG. 1 illustrates, in block diagram form, a data processing system according to an embodiment of the present invention.

According to one aspect of the present invention, a method of memory test detects defects in a memory array which are sensitive to environmental conditions. An environmentally sensitive defect is characterized by any change in the repair state of the memory device over the operating range of the memory device. The method generates a signature value to reflect the repair state of the memory device at a first operating condition and generates a second signature value to reflect the repair state of the memory device at a second operating condition. Environmentally sensitive defects are detected when the second signature value is different from the original signature value. Effectively, a memory device is rejected if there is a change in the repair state of the memory array over the operating range of the device.

The term "bus" will be used to refer to a plurality of signals or conductors which may be used to transfer one or more various types of information, such as data, addresses, control, or status. The terms "assert" and "negate" will be used when referring to the rendering of a signal, status bit, or similar apparatus into its logically true (i.e. active or asserted) or logically false (i.e. inactive or negated) state, respectively. If the logically true state is a logic level one, the logically false state will be a logic level zero. And if the logically true state is a logic level zero, the logically false state will be a logic level one.

In one aspect of the present invention, an integrated circuit, includes a memory array; a plurality of spare memory elements for repairing defective locations of the memory array; a built-in self-test circuit, coupled to the memory array, for detecting faults in the memory array, and in response to detecting a fault, storing an address corresponding to a failed memory location that caused the fault and producing an output signal indicating when a fault is detected; a built-in self-repair circuit, coupled to the memory array, for causing the failed memory location of the memory array to be replaced with a spare memory element of the plurality of spare memory elements; and a built-in self-repair monitoring circuit, coupled to the built-in self-test circuit, for generating a signature based on a compression of addresses corresponding to failed memory locations, wherein the signature is used to determine that a repair result of the memory array is invariant over different environmental conditions.

In another aspect of the present invention, a data processing system, includes a central processing unit; a memory array, coupled to the central processing unit, for storing information for use by the central processing unit; a plurality of spare memory elements for repairing defective locations of the memory array; a built-in self-test circuit, coupled to the memory array, for selectively detecting defects in the memory array, and in response to detecting a defect, providing an address corresponding to a defective memory location and producing an output signal for indicating when a defect is detected; a built-in self-repair circuit, coupled to the memory array, for selectively causing a defective memory location of the memory array to be repaired with a spare memory element of the plurality of spare memory elements; and a built-in self-repair monitoring circuit, coupled to the built-in self-test circuit, for generating a signature based on a compression of addresses corresponding to defective memory locations, wherein the signature is used to determine that a repair result of the memory array is invariant over different environmental conditions.

In another aspect of the invention, a method for testing and repairing an embedded memory in an integrated circuit includes the steps of: (i) setting a first predetermined environmental condition for testing the embedded memory; (ii) activating a built-in self-test circuit and a built-in self-repair circuit to detect and repair faulty memory cells of the embedded memory under the first predetermined environmental condition; (iii) generating a first signature based on addresses of the faulty memory cells determined during testing under the first predetermined environmental condition; (iv) providing the first signature to a first storage location; (v) setting a second predetermined environmental condition for testing the embedded memory; (vi) clearing results of detecting and repairing faulty memory cells under the first predetermined environmental condition; (vii) activating the built-in self-test circuit and the built-in self-repair circuit to detect and repair faulty memory cells of the embedded memory under the second predetermined environmental condition; (viii) generating a second signature based on addresses of the faulty memory cells determined during testing under the second predetermined environmental condition; (ix) providing the second signature to a second storage location; and (x) comparing the first signature to the second signature, and if the first signature is not the same as the second signature, determining that the embedded memory does not meet a predetermined specification.

FIG. 1 illustrates data processing system 5 according to one embodiment of the present invention. Data processing system 5 includes a central processing unit (CPU) 15, BIST 30, BISR monitoring circuit 31, memory 41, memory controller 20, memory interface 37 and BISR circuit 39. CPU 15 is coupled to memory interface 37 by way of address bus 6 and data bus 7. Memory controller 20 is coupled to CPU 15 by way of multiple conductors. Memory controller 20 provides a control signal to memory interface 37 by way of conductors 8. Memory 41 is a memory having redundant spare elements, such as found in a dynamic random access memory (DRAM) or a static random access memory (SRAM).

Memory interface 37 is used to multiplex address, data and control between CPU 15 and BIST 30. For normal operation, memory interface 37 receives address information from CPU 15 via address bus 6 and transfers that information to memory 41 via address bus 9. According to one embodiment, addresses busses 6 and 9 are unidirectional multiconductor busses. Similarly, memory interface 37 communicates data information with CPU 15 via bidirectional data bus 7 and with memory 41 via bidirectional data bus 11. Memory controller 20 monitors operation of CPU 15 and provides control signals to memory interface 37 via conductors 8, where the control signals provide information necessary for communication with memory 41 via conductors 13. Control signals include any number of signals, such as a read/write (R/W) indicator, a chip select signal (CS), a row address strobe (RAS), and column address strobe (CAS).

Memory interface 37 receives a GOBIST signal to initiate internal memory testing. In response to the GOBIST signal, memory interface 37 receives address information from BIST 30 via address bus 17. Memory interface 37 communicates data information via data bus 19 and control information via conductors 21. During BIST operation address is provided to memory 41 via address bus 9, data is communicated with memory 41 via data bus 11, and control information is provided by conductors 13. BIST 30 is an internal testing unit used to detect defects in memory array 40. BIST 30 includes address generator 36 and data compare 34. During BIST operation, address generator 36 generates an address to be tested. According to one embodiment, BIST tests rows sequentially starting with an initial row and sequencing through the entire array. The address to be tested is provided to memory interface 37, which conveys the information to memory 41.

BISR monitoring circuit 31 includes error qualifier 38 and signature generator 32. Address generator 36 provides row address information to error qualifier 38. The row address information is the portion of the address identifying the row of the address under test. Error qualifier 38 also receives pass/fail information from data compare 34. On receipt of a fail indicator, error qualifier 38 compares the row address received from address generator 36 to a fail history of memory array 40. If there is a match, error qualifier 38 ignores the fail indication by negating the QFAIL signal. However, if there is no match detected, error qualifier 38 asserts the signal QFAIL, which indicates a first failure of this row. QFAIL is provided to signature generator 32, which creates a repair signature, where the repair signature is based on a compression of those rows which resulted in assertion of QFAIL. The repair signature is initialized to a start value and is thereafter updated each time QFAIL is asserted during BIST/BISR operation. The repair signature reflects the repair state of memory array 40 at completion of BIST/BISR operation. The repair state is a characteristic of the defective rows replaced during this repair cycle. The repair signature is a surrogate of the repair state of memory 41.

While the present embodiment describes memory device 41 as having redundant elements characterized as spare rows, alternate embodiments may include spare columns and/or a combination of spare rows and columns. Data compare 34 is coupled to memory interface 37 by way of a bidirectional data bus 19. Data compare 34 generates memory input data to be used during BIST testing and verifies the memory output data at the address under test. When an error is detected, data compare 34 provides a fail indication to error qualifier 38, and provides a repair signal to BISR circuit 39. BISR circuit 39 is coupled to row decoder logic 46. Memory array 40 is coupled to row decoder logic 46 and column logic 44. At least one spare row is located within memory array 40, and may be located adjacent to memory array 40. Row decoder logic 46 and column logic 44 are responsive to address information received from memory interface 37. Each cell within memory array 40 is identified by a row and column location. When memory array 40 receives address information from memory interface 37, row decoder logic 46 decodes the row of that address and column logic decodes the column of the address.

When the REPAIR signal is asserted, BISR circuit 39 replaces the row containing the defective memory cell with an available row from spare row 42. BISR circuit 39 is able to replace as many defective rows of memory array 40 as there are spare rows for replacement for memory array 40. In one embodiment, BISR circuit 39 alters a repair bit to modify the behavior of row decoder logic 46, such that a spare row 42 of memory 41 is allocated to respond to the defective row address. In another embodiment, BISR circuit 39 includes a content addressable memory (CAM) and a spare row of memory cells; BISR circuit 39 enters an address of a memory row into the CAM, where each location in the CAM has a corresponding allocated spare row of memory cells. In this embodiment, data is multiplexed from memory 41 or spare rows 42 onto data bus 11, and address information is provided from memory interface 37 to BISR circuit 39.

BIST 30 performs memory testing for each row of memory array 40. As a defective memory cell is detected, the memory row is replaced. During production, testing will often test the memory device over a range of operating conditions. If the signature generated on any iteration of the BIST/BISR process differs from a previous signature, the device is rejected. The signature generation and confirmation checks for repeatability of repair ensuring consistent, correct operation of the memory device.

BIST 30 provides a DONE signal upon completion of testing and repair, a REJECT/ACCEPT indicator of the success of BIST/BISR testing and repairing, and a repair signature (REPAIR SIGNATURE). In one embodiment, REPAIR SIGNATURE is a serial output of BISR monitoring circuit 31. In an alternate embodiment, REPAIR SIGNATURE is a multiple bit signal provided in parallel on multiple conductors.

Figure 2:
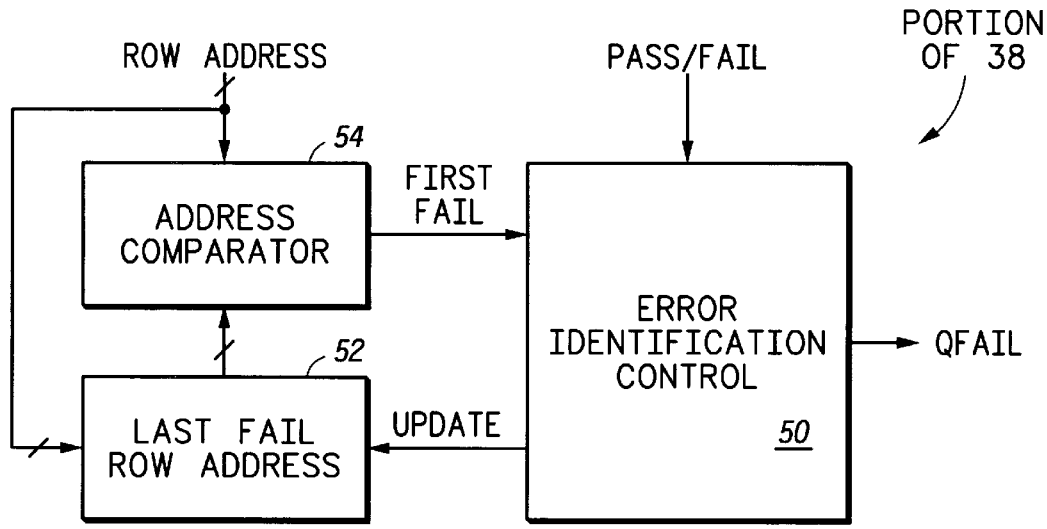
FIGS. 2 and 3 illustrate, in block diagram form, error qualifier 38 of FIG. 1, according to embodiments of the present invention.

FIG. 2 illustrates an embodiment of error qualifier 38 of FIG. 1. Row address information is provided to address comparator 54 by address generator 36. Last fail row address 52 stores the address of the last failing row. Row address information is provided to last fail row address 52 from address generator 36, and is updated in response to an UPDATE signal received from error identification control 50. On receipt of a FAIL signal, address comparator 54 compares the address of the present row under test to the address stored in the last fail row address 52. If the current row address and the last fail row address match, no error identification is indicated and the FIRST FAIL signal is negated. If the current row address and the last row address do not match error identification is indicated and the FIRST FAIL, UPDATE, and QFAIL signals are asserted.

For example, where BIST 30 tests row address 1000 in memory array 40, BIST 30 tests all cells within row 1000 sequentially by testing all of the column addresses for that row. During the testing of row 1000, only the row address information is provided to error qualifier 38, even though each cell is identified by row address 1000 and a specific column address. If any cell in row 1000 fails, the address 1000 is stored in last fail row address 52. As testing continues through row 1000, any subsequent failing cells in row 1000 have the same row address. If the row address stored in last fail row address 52 is 1000, any failing cell in row 1000 will result in a comparison match. In this way, address comparator 54 will only indicate a first failed memory cell, i.e., a mismatch of the current failed row address and the last failed row address. When the two addresses do not match, address comparator 54 provides a first fail signal to error identification control 50 by asserting FIRST FAIL. Error identification control 50 also receives a pass/fail indicator from data compare 34. For a pass condition, error identification control 50 ignores any first fail indicator received from address comparator 54. For a fail condition, error identification control asserts the QFAIL and UPDATE signals in response to a first fail signal from address comparator 54. In this way, a fail indication from data compare 34 initiates operation of error identification control 50, and will generate an update signal to last fail row address 52 upon receipt of a first fail signal from address comparator 54. Upon receipt of the update signal, last fail row address 52 latches the row address information replacing the last fail row address.

Figure 3:
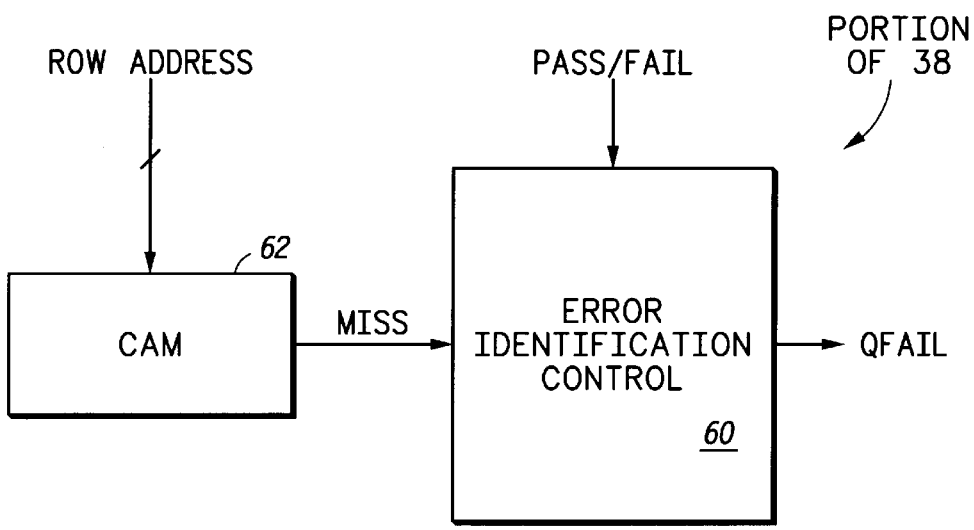

An alternate embodiment of error qualifier 38, illustrated in FIG. 1, is illustrated in FIG. 3. Here, CAM 62 receives row address information from address generator 36, and provides a miss indicator, MISS, to error identification control unit 60. Error identification control unit 60 is enabled by the PASS/FAIL signal indicating FAIL received from data compare 34. For a pass condition, error identification control 60 ignores any MISS signal received from CAM 62. For a fail condition, error identification control 60 generates a QFAIL signal in response to receipt of a miss signal from CAM 62.

A content addressable memory (CAM) may be used to store the failed row address history information. CAM 62 includes a plurality of memory cells, for storing data, and a data comparator for each entry. CAM 62 is used to store each row address which has failed the BIST 30 testing. CAM 62 compares a received failing row address with data stored within each of its entries. If there is a match, the miss signal is not generated, as this address has previously been identified as a failed row. When the received row address does not match any of the contents of the entries within CAM 62, a miss signal is generated, the received address is loaded as a next entry in CAM 62, and QFAIL is asserted.

Referring again to FIG. 1, signature generator 32 receives a QFAIL signal from error qualifier 38. Signature generator 32 then generates a repair signature, which is a surrogate representation of the repair state of memory 41. The repair state describes which row addresses failed and were replaced. The repair state is effectively mapped into the signature, which is then used to check for changes in the repair state. Any change in the signature indicates a change in the repair state, i.e. a change in the replacement of rows in memory 41. In one embodiment, the mapping of repair state into a signature incorporates a generation scheme that provides a sequence of unique, nonrepeating values sufficient for correspondence with the entire repair state space. There are many ways to implement a signature generator; the implementation selection is based on design criteria, such as the risk of aliasing, and the cost of implementation. For example, where the signature is generated as a function only of the QFAIL signal, such as by use of a counter, there is a risk of aliasing. This risk is introduced as the QFAIL indicates that a fail occurred, but the signature generation does not consider which address failed. In contrast, when the signature is generated as a function of the failing row address, such as by use of an accumulator, the risk of aliasing is reduced, but the cost of implementation is increased. The latter method reduces the risk of aliasing as the signature now considers more specific information, i.e. the failing row address.

In one embodiment, signature generator 32 of FIG. 1 is implemented by a counter, and the signature generated is a function of QFAIL. The counter may be a binary counter, a linear feedback shift register, gray code counter, or any other circuitry for generating a sequence of non-repeating values over a defined space. The counter is first initialized to a known value, and incremented on each occurrence of QFAIL. Upon completion of BIST testing the repair signature is available from signature generator 32 on a bus as a multiple bit signature. Alternate embodiments may output the signature in a serial manner.

Figure 4:
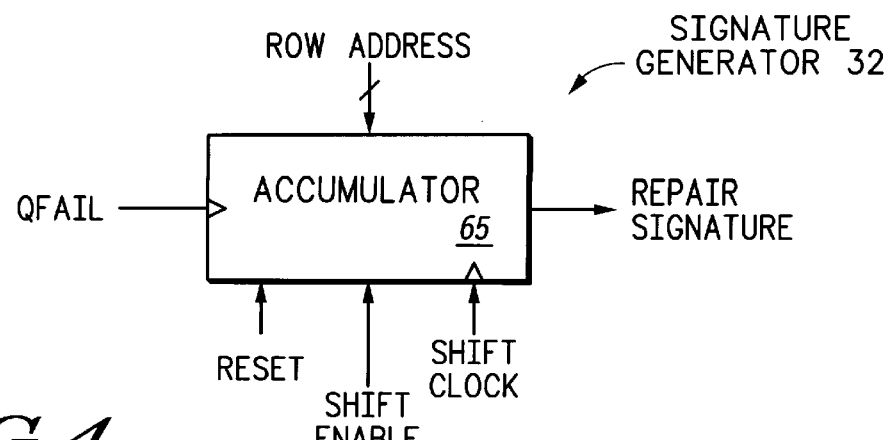
FIG. 4 illustrates, in block diagram form, signature generator 32 of FIG. 1, according to an embodiment of the present invention.

In an alternate embodiment illustrated in FIG. 4, signature generator 32 includes an accumulator 65, and the signature generated is a function of the failed row addresses. Accumulator 65 performs an arithmetic or logic function possessing a commutative property, such as an addition operation or a subtraction operation. Accumulator 65 stores the result of successive operations in response to assertion of the QFAIL signal. Accumulator 65 receives a reset signal for initialization to a known value. Accumulator 65 receives a current row address of a row under test. QFAIL is provided to accumulator 65 by error qualifier 38. Assertion of QFAIL instructs accumulator 65 to process the received current row address with the accumulated value. Upon completion of BIST testing, accumulator 65 receives an asserted shift enable signal instructing accumulator 65 to serially shift the accumulated value out as the repair signature. A shift clock is provided to accumulator 65 for output control of the repair signature. Alternate embodiments may output the signature in a parallel manner via an output bus or other parallel communication means.

During production, the repair signature will be captured on the test equipment and may be tracked throughout the device's test. Typically, the test equipment will compare a first signature with a second signature to see if there has been a change. When a signature changes due to environmental conditions, such as voltage or temperature change, the device is rejected.

Figure 5:
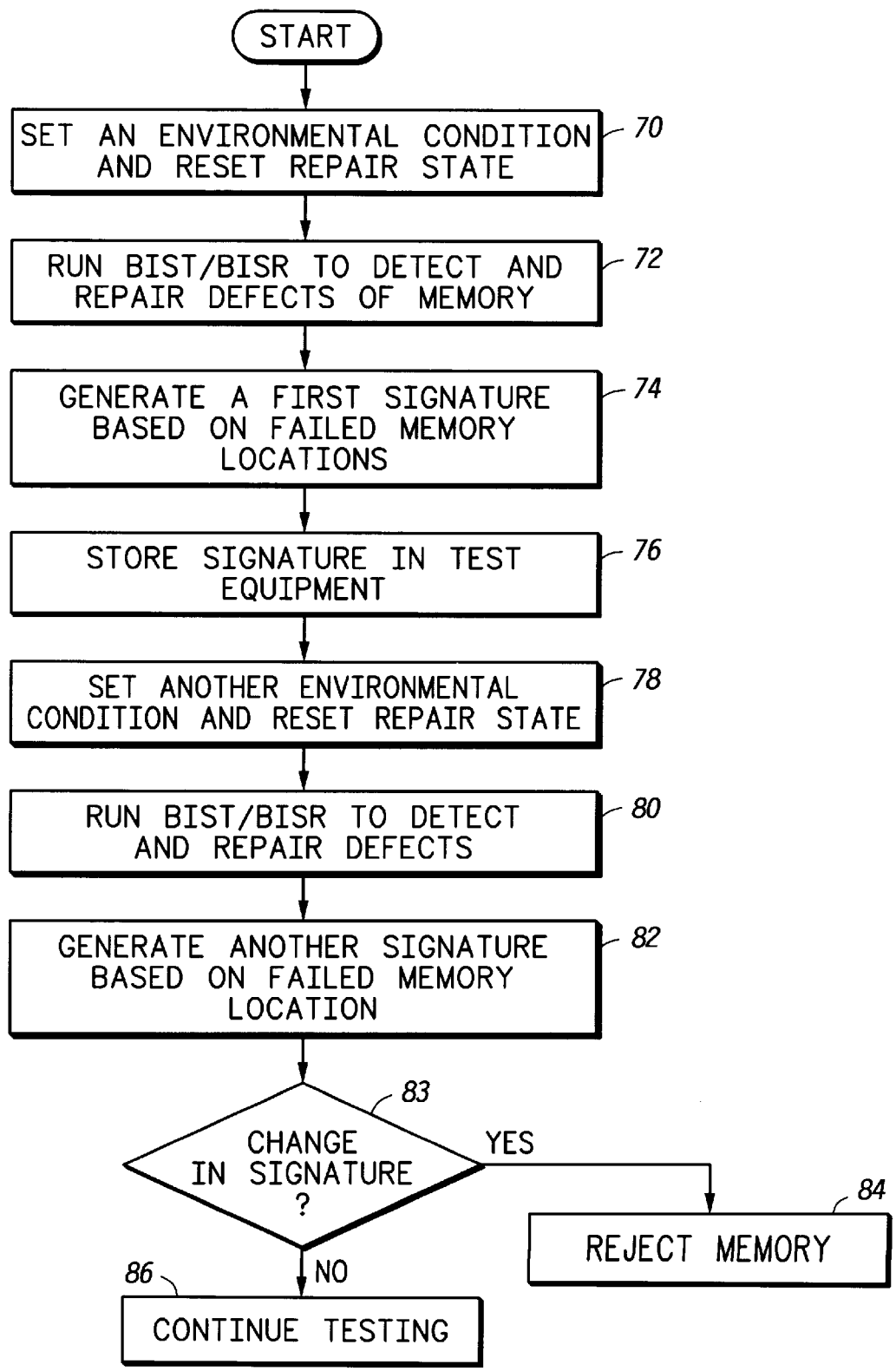
FIG. 5 illustrates, in flow diagram form, a process of memory repair monitoring according to one embodiment of the present invention.

BIST test procedure according to one embodiment is illustrated in FIG. 5. BIST 30 testing begins at the start block and proceeds to block 70 where initial environmental conditions are set. The environmental condition describes the testing environment, and may include any number of conditions, such as voltage level, temperature, and frequency of operation of the device. The environmental conditions are typically controllable by external automated test equipment (ATE). The test equipment generates signals to test the device and set the conditions in which the device is to be tested.

Processing flow continues to block 72, where the BIST 30 test cycle and BISR monitoring circuit 31 repair cycle is run. BIST 30 testing is done to detect defects in memory 41, BISR monitoring circuit 31 and BISR circuit 39 performs repair of the defective memory elements. During BIST testing, a predetermined pattern of operations is applied to memory array 40. A typical pattern will include a series of read and write operations performed on memory array 40 to detect defects in operation of memory array 40. BIST 30 generates an address for testing and then performs a sequence of read/write operations. Output data comparison checks that the data in memory array 40 is valid for the sequence of operations. When the data comparison fails, the error is qualified according to row address and a repair signature is generated in block 74. The first repair signature generated is based on the failed memory locations found in the first BIST/BISR test cycle. Processing flow continues to block 76 where the signature is stored in external test equipment. Note that the signature may be processed externally by an ATE or internally within the the integrated circuit.

At block 78, a second environmental condition is set. The second environmental condition may change multiple conditions or may only change one condition. Processing flow continues to block 80 where BIST/BISR testing and repair is performed once again to detect and repair defects. At the completion of this second BIST/BISR testing and repair cycle, a second repair signature is generated to indicate the failed memory locations discovered during the second BIST/BISR testing and repair cycle. At decision block 83 the first signature is compared to the second signature. Decision block 83 determines if there is a change in the signature. If there is a change in the signature, then the memory is rejected at block 84. If there is no change in the signature, then testing continues at block 86. If the two signatures are the same, testing continues and may include the testing of other modules or a return to block 78 to set another environmental condition.

Although the invention has been described and illustrated with reference to specific embodiments, it is not intended that the invention be limited to those illustrative elements. Therefore, it is intended that this invention encompass all of the variations and modifications as fall within the scope of the appended claims.

What is claimed is:

1. An integrated circuit, comprising:
   a memory array;
   a plurality of spare memory elements for repairing defective locations of the memory array;
   a built-in self-test circuit, coupled to the memory array, for detecting faults in the memory array, and in response to detecting a fault, providing an address corresponding to a failed memory location that caused the fault and producing an output signal indicating when a fault is detected;

a built-in self-repair circuit, coupled between the built-in self-test circuit and the memory array, the repair circuit causing the failed memory location of the memory array to be replaced with a spare memory element of the plurality of spare memory elements; and a built-in self-repair monitoring circuit, coupled to the built-in self-test circuit and comprising a signature generator, the built-in self-repair monitoring circuit generating a signature based on a compression of addresses corresponding to failed memory locations, wherein the signature is used to determine that a repair result of the memory array is invariant over different environmental conditions.

2. The integrated circuit of claim 1, wherein the plurality of spare memory elements are characterized as being spare rows of memory cells.

3. The integrated circuit of claim 1, wherein the plurality of spare memory elements are characterized as being spare columns of memory cells.

4. The integrated circuit of claim 1, further comprising an error qualifier having an input for receiving addresses corresponding to failed memory locations, and in response, providing a failure output signal to the signature generator, in response to the failure output signal the signature generator updating the signature.

5. The integrated circuit of claim 4, wherein the error qualifier comprises:

an address comparator having a first input for receiving the addresses corresponding to the failed memory locations indicating a current failing address, a second input for receiving a last failing address, and an output for providing a comparison result;

an address register having an input for receiving the addresses corresponding to the failed memory locations, a second input terminal for receiving an update signal, and an output terminal coupled to the second input of the address comparator, the address register storing the last failing address; and a control unit having a first input for receiving the comparison result, a second input for receiving the output signal from the built-in self-test circuit, a first output for providing the update signal, and a second output for providing the failure output signal to the signature generator.

6. The integrated circuit of claim 4, wherein the error qualifier comprises:

a content addressable memory having an input for receiving the addresses corresponding to the failed memory locations, and an output for providing a miss signal, the miss signal being provided in response to the content addressable memory determining that a current address of the addresses corresponding to failed memory locations has not been previously loaded, and upon generating the miss signal, loading the current address; and a control unit having a first input for receiving the output signal from the built-in self-test circuit, and second input coupled to the output of the content addressable memory, and an output for providing the failure output signal to the signature generator.

7. The integrated circuit of claim 4, wherein the signature generator includes a counter.

8. The integrated circuit of claim 4, wherein the signature generator includes an accumulator.

9. The integrated circuit of claim 4, wherein the signature generator outputs the signature as a serial output.

10. The integrated circuit of claim 4, wherein the signature generator outputs the signature as a parallel output.

11. The integrated circuit of claim 4, wherein the signature generator includes a first input for receiving the addresses corresponding to the failed memory locations, a second input for receiving the failure output signal, a third input for receiving a shift clock signal, a fourth input for enabling a shift operation in the signature generator, a fifth input for receiving an initialization signal, and an output for providing the signature.

12. The integrated circuit of claim 1, wherein the memory array is embedded on a common semiconductor substrate with other circuits.

13. The integrated circuit of claim 12, wherein the memory array is characterized as being a dynamic random access memory.

14. The integrated circuit of claim 12, wherein the memory array is characterized as being a static random access memory.

15. A data processing system, comprising:

a central processing unit;

a memory array, coupled to the central processing unit, for storing information for use by the central processing unit;

a plurality of spare memory elements for repairing defective locations of the memory array;

a built-in self-test circuit, coupled to the memory array, for selectively detecting defects in the memory array, and in response to detecting a defect, providing an address corresponding to a defective memory location and producing an output signal for indicating when a defect is detected;

a built-in self-repair circuit, coupled to the memory array, the built-in self-repair circuit selectively causing a defective memory location of the memory array to be repaired with a spare memory element of the plurality of spare memory elements; and a built-in self-repair monitoring circuit, coupled to the built-in self-test circuit, the built-in self-repair monitoring circuit comprising a signature generator, the built-in self-repair monitoring circuit generating a signature based on a compression of addresses corresponding to defective memory locations, wherein the signature is used to determine that a repair result of the memory array is invariant over different environmental conditions.

16. The data processing system of claim 15, wherein the compression of the addresses is accomplished using an accumulator, the accumulator having an input for receiving the addresses corresponding to defective memory locations, the accumulator performing the compression, and in response, providing the signature as an output.

17. The data processing system of claim 15, wherein the built-in self-test circuit and built-in self-repair circuit are activated in response to assertion of a built-in self-test activation signal.

18. The data processing system of claim 15, further comprising an error qualifier having an input for receiving addresses corresponding to defective memory locations, providing a failure output signal to the signature generator, in response the signature generator updating the signature.

19. The data processing system of claim 18, wherein the error qualifier comprises:

an address comparator having a first input for receiving the addresses corresponding to the defective memory locations indicating a current defective address, a second input for receiving a last defective address, and an output for providing a comparison result;

an address register having an input for receiving the addresses corresponding to the defective memory locations, a second input terminal for receiving an update signal, and an output terminal coupled to the second input of the address comparator, the address register storing the last defective address; and a control unit having a first input for receiving the comparison result, a second input for receiving the output signal from the built-in self-test circuit, a first output for providing the update signal, and a second output for providing the failure output signal to the signature generator.

20. The data processing system of claim 18, wherein the error qualifier comprises:

a content addressable memory having an input for receiving the addresses corresponding to the defective memory locations, and an output for providing a miss signal, the miss signal being provided in response to the content addressable memory determining that a current address of the addresses corresponding to defective memory locations has not been previously loaded, and upon generating the miss signal, loading the current address; and a control unit having a first input for receiving the output signal from the built-in self-test circuit, and a second input coupled to the output of the content addressable memory, and an output for providing the failure output signal to the signature generator.

21. A method for testing and repairing an embedded memory in an integrated circuit, comprising the steps of:

setting a first predetermined environmental condition for testing the embedded memory;

activating a built-in self-test circuit and a built-in self-repair circuit to detect and repair faulty memory cells of the embedded memory under the first predetermined environmental condition;

generating a first signature based on addresses of the faulty memory cells determined during testing under the first predetermined environmental condition;

providing the first signature to a first storage location;

setting a second predetermined environmental condition for testing the embedded memory;

clearing results of detecting and repairing faulty memory cells under the first predetermined environmental condition;

activating the built-in self-test circuit and the built-in self-repair circuit to detect and repair faulty memory cells of the embedded memory under the second predetermined environmental condition;

generating a second signature based on addresses of the faulty memory cells determined during testing under the second predetermined environmental condition;

providing the second signature to a second storage location; and comparing the first signature to the second signature, and if the second signature is different from the first signature, determining that the embedded memory does not meet a predetermined specification.

22. The method of claim 21, wherein the method for testing comprises testing an embedded memory having a plurality of dynamic random access memory cells.

23. The method of claim 21, wherein the steps of generating the first and second signatures each comprises generating the first and second signatures based on a compression of the addresses of the faulty memory cells.

24. The method of claim 22, wherein the step of generating the first and second signatures further comprises generating the first and second signatures using an accumulator.

* * * * *